United States Patent
Nakamura

(10) Patent No.: US 7,738,461 B2
(45) Date of Patent: Jun. 15, 2010

(54) COMMUNICATION APPARATUS AND SWITCHING DEVICE

(75) Inventor: Masato Nakamura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 207 days.

(21) Appl. No.: 11/914,057

(22) PCT Filed: May 8, 2006

(86) PCT No.: PCT/PJ2006/309260

§ 371 (c)(1),
(2), (4) Date: Dec. 31, 2007

(87) PCT Pub. No.: WO2006/121014

PCT Pub. Date: Nov. 16, 2006

(65) Prior Publication Data

US 2009/0103441 A1   Apr. 23, 2009

(30) Foreign Application Priority Data

May 9, 2005   (JP)   ............................. 2005-136036

(51) Int. Cl.
*H04L 12/28*   (2006.01)
(52) U.S. Cl. ....................... 370/392; 370/241; 370/403; 370/466
(58) Field of Classification Search ................. 370/241, 370/338, 352, 466, 392, 403
See application file for complete search history.

(56) References Cited

U.S. PATENT DOCUMENTS

| 4,577,313 | A | * | 3/1986 | Sy ............................. 370/403 |
| 5,062,111 | A | * | 10/1991 | Gotou et al. ................. 714/781 |
| 6,446,131 | B1 | * | 9/2002 | Khansari et al. ............ 709/238 |
| 6,452,691 | B1 | | 9/2002 | Marshall |
| 6,594,249 | B1 | | 7/2003 | Goldberg |
| 6,611,519 | B1 | | 8/2003 | Howe |
| 6,785,263 | B1 | | 8/2004 | Morinaga et al. |

(Continued)

FOREIGN PATENT DOCUMENTS

JP   60-10940 A   1/1985

(Continued)

OTHER PUBLICATIONS

Carrier sense multiple access with collision detection (CSMA/CD) access method and physical layer specifications, IEEE Std 802.3, Mar. 8, 2002, p. 61, The Institute of Electrical and Electronics Engineers, Inc.

*Primary Examiner*—Ricky Ngo
*Assistant Examiner*—Rasheed Gidado
(74) *Attorney, Agent, or Firm*—Sughrue Mion, PLLC

(57) ABSTRACT

A CRC calculating unit calculates a DCS code for a DA field to a DATA field and an FCS code for the DA field to a DCS field. A DCS checking unit outputs a DCS check result with a calculated DCS code and a DCS code in the DCS field to a terminal operating unit. An FCS checking unit outputs an FCS check result with a calculated FCS code and an FCS code in the FCS field to an FCS converting unit. The FCS checking unit determines whether to forward through the frame or to forward the frame by storing the calculated FCS code in the FCS field based on the FCS check result. The terminal operating unit determines a processing mode based on the DCS check result.

6 Claims, 11 Drawing Sheets

U.S. PATENT DOCUMENTS

| | | |
|---|---|---|
| 6,882,656 B2 | 4/2005 | Bunton et al. |
| 2002/0090007 A1* | 7/2002 | Kamiya et al. ............... 370/476 |

FOREIGN PATENT DOCUMENTS

| | | |
|---|---|---|
| JP | 60-264143 A | 12/1985 |
| JP | 61-154243 A | 7/1986 |
| JP | 3-11838 A | 1/1991 |
| JP | 4-129445 A | 4/1992 |
| JP | 8-37541 A | 2/1996 |
| JP | 2002-314606 | 10/2002 |

* cited by examiner

FIG.6

| PATTERN | 1 | 2 | 3 | 4 |
|---|---|---|---|---|
| RESULT OF DCS CHECK | OK | NG | OK | NG |
| RESULT OF FCS CHECK | OK | OK | NG | NG |
| EXECUTE FCS REPLACEMENT | NO | NO | YES | YES |
| UPDATE ERROR FRAME COUNTER | NO | NO | YES | YES |
| PROCESSING OF TERMINAL OPERATING UNIT | NORMAL PROCESSING | ERROR PROCESSING | NORMAL PROCESSING | ERROR PROCESSING |

COMMUNICATION APPARATUS AND SWITCHING DEVICE

TECHNICAL FIELD

The present invention relates to a communication apparatus applied to a network system in which a layer 2 frame is used, and more particularly, to a communication apparatus and a switching device applied to a cut-through network system.

BACKGROUND ART

Conventionally, there has been developed various technologies for detecting an error in a communication frame using a CRC (cyclic redundancy check). For example, the IEEE Standard 802.5 Token Ring, which is a ring-shaped network, is composed of a single master node device and a plurality of slave node devices. If a received frame is in a normal condition, each of the slave node devices transmits a frame in which data and a BCC (Block Check Character) are scrambled in a legitimate manner. If the received frame is in an abnormal condition (i.e., an error is detected in the frame), each of the slave node devices transmits a frame in which data and a BCC are scrambled in a manner different from the legitimate manner. Namely, once any of the slave node devices detects an error in a frame, the slave node device circulates a frame that causes an error every time the other slave node devices descramble the frame in a legitimate manner, so that an error occurs in the subsequent slave node devices, and also the master node device can recognize the occurrence of the error (for example, see patent document 1).

Patent document 1: Japanese Patent Application Laid-open No. H08-37541

DISCLOSURE OF INVENTION

Problem to be Solved by the Invention

In an industrial network system, performances in real-time processing and maintenances have been emphasized in recent years, so that an introduction of Ethernet (registered trademark) technologies has been actively promoted.

In an Ethernet (registered trademark) network (hereinafter, referred to as a "layer 2 network"), as defined in the IEEE 802.3, the CRC is employed for an error detection (a detection of garbled data) in an Ethernet (registered trademark) frame (hereinafter, referred to as "a layer 2 frame").

Specifically, the layer 2 frame includes a destination address field, a source address field, a type field, a data field, and a frame check sequence (FCS) field. The layer 2 frame is created in such a manner that a node device (a communication apparatus) arranged in a network performs a CRC calculation of a destination address, a source address, a type, and data, and stores a result of the calculation in the FCS field, and then the created layer 2 frame is transmitted. Upon receiving the layer 2 frame, the communication apparatus performs a CRC calculation of the destination address, the source address, the type, and the data of the received layer 2 frame, and compares a result of the calculation with that is stored in the FCS field of the received layer 2 frame, i.e., the result of the CRC calculation obtained at the time of transmission, and thereby detecting garbled data.

Meantime, as a switching method of the layer 2 frame, there are a cut-through switching method and a store-and-forward switching method. In the store-and-forward switching method, upon receiving a layer 2 frame, the communication apparatus determines a forwarding address of the received layer 2 frame, and forwards the layer 2 frame. On the other hand, in the cut-through switching method, the destination address field in which a destination address of the layer 2 frame is stored is located followed by a start frame delimiter of the layer 2 frame, so that the communication apparatus determines the forwarding address upon receiving the destination address field, and starts transmitting the layer 2 frame based on a result of the determination.

Therefore, a forwarding delay time, which is a time period from a starting time of receiving the layer 2 frame to a starting time of transmitting the received layer 2 frame, is shorter in a case of the cut-through switching method in which forwarding of the layer 2 frame is started upon reception of the destination address field of the layer 2 frame, as compared with that is in a case of the store-and-forward switching method in which forwarding of the layer 2 frame is started after reception of the last field (the FCS field) of the layer 2 frame. Thus, in the industrial network system in which a warranty of the performance in real-time processing is required, the communication apparatus using the cut-through switching method is employed in most cases.

However, according to the conventional technology disclosed in the above-mentioned patent document 1, after it is determined whether any error occurs, a scrambling process on the data and the BCC (corresponding to the FCS in the layer 2 frame) is determined. Therefore, it is not possible to use the cut-through switching method in which forwarding of the layer 2 frame is started upon reception of the destination address field of the layer 2 frame.

In the case of using the store-and-forward switching method, according to the conventional technology disclosed in the above-mentioned patent document 1, once an error is detected in the layer 2 frame, it is possible to cause an error definitely in the subsequent communication apparatuses as well, and it is also possible to let the master communication apparatus to recognize the occurrence of the error surely, but it is not possible to identify a transmission path where the error occurs.

Namely, according to the conventional technology disclosed in the above-mentioned patent document 1, once an error occurs, a frame that causes an error is continuously forwarded until the frame is eliminated from the network, so that even though the communication apparatus holds error information, it is not possible to determine whether the error occurs due to the transmission path or the error occurs because the communication apparatus receives the layer 2 frame that causes the error.

Moreover, even in a case where the network is composed of the communication apparatuses using the cut-through switching method that most of layer 2 frames are forwarded, when an error is detected in the layer 2 frame, a layer 2 frame that causes an error is continuously forwarded until the layer 2 frame is eliminated from the network, so that, in the same manner as the conventional technology disclosed in the above-mentioned patent document 1, it is not possible to identify a transmission path where the error occurs.

Especially, as can be seen in a token-passing method, in a case where a network-attached communication apparatus forwards a layer 2 frame, and a plurality of transmission paths have an error, it is impossible to identify portions of the transmission paths having the error.

The present invention has been developed in consideration of the above situations, and an object of the present invention is to achieve a communication apparatus capable of identifying a transmission path where an error occurs even in a case of using the cut-through switching method.

Means for Solving Problem

To solve the above problems and to achieve the abject, a communication apparatus according to the present invention includes a terminal operating unit that performs a process of receiving a frame; and a switching unit that outputs a received frame to the terminal operating unit, and forwards the received frame by a cut-through method. The frame includes a destination-address (DA) field in which a destination address is stored, a source-address (SA) field in which a source address is stored, a Type field in which a frame length is stored, a DATA field in which user data subjected to be transmitted is stored, a data check sequence (DCS) field in which a DCS code as a check code used for an error detection of data stored in the DA field, the SA field, the Type field, and the DATA field is stored, and a frame check sequence (FCS) field in which an FCS code as a check code used for an error detection of data stored in the DA field, the SA field, the Type field, the DATA field, and the DCS field is stored. The switching unit calculates a DCS code based on data stored in the DA field, the SA field, the Type field, and the DATA field of the received frame and an FCS code based on data stored in the DA field, the SA field, the Type field, the DATA field, and the DCS field of the received frame, compares the calculated DCS code with the DCS code stored in the DCS field of the received frame, and outputs a result of a comparison to the terminal operating unit as a result of a DCS check, and compares the calculated FCS code with the FCS code stored in the FCS field of the received frame to obtain a result of a comparison as a result of an FCS check, and forwards the received frame without any change if the result of the FCS check is matching, and forwards a frame that the calculated FCS code is stored in the FCS field of the received frame if the result of the FCS check is mismatching. The terminal operating unit executes normal processing based on a frame input from the switching unit if the result of the DCS check is matching, and executes error processing if the result of the DCS check is mismatching.

Effect of the Invention

In a communication system according to the invention, at the time of receiving a frame including a DA field in which a destination address is stored; an SA field in which a source address is stored; a Type field in which a frame length is stored; a DATA field in which user data subjected to be transmitted is stored; a DCS field in which a DCS code as a check code used for an error detection of data stored in the DA field, the SA field, the Type field, and the DATA field is stored; and an FCS field in which an FCS code as a check code used for an error detection of data stored in the DA field, the SA field, the Type field, the DATA field, and the DCS field is stored, a DCS code and an FCS code are calculated, and it is determined whether any error occurs in the DA field, the SA field, the Type field, and the DATA field of the received frame based on a result of such a DCS check that the calculated DCS code is compared with the DCS code stored in the DCS field of the received frame, and if a result of such an FCS check that the calculated FCS code is compared with the FCS code stored in the FCS field of the received frame is matching, the received frame is forwarded without any change, conversely, if the result of the FCS check is mismatching, a frame that the calculated FCS code is stored in the FCS field of the received frame is forwarded. Namely, when data in the frame is garbled even once while the frame is forwarded, the result of the DCS check is mismatching. Also, only when a failure occurs in the transmission path between the local communication apparatus and the adjacent communication apparatus, the result of the FCS check is mismatching. Therefore, it is possible to recognize the validity of data in the frame and any occurrence of failure in the transmission paths. Consequently, even in a case of using the cut-through switching method, it is possible to identify the transmission path having a failure without circulating an error frame in the network.

BRIEF DESCRIPTION OF DRAWINGS

FIG. 6 is a schematic diagram for explaining processing operations of an FCS converting unit, an error frame counter, and a terminal operating unit with respect to a result of a DCS check and a result of an FCS check.

EXPLANATIONS OF LETTERS OR NUMERALS

Figure 1:
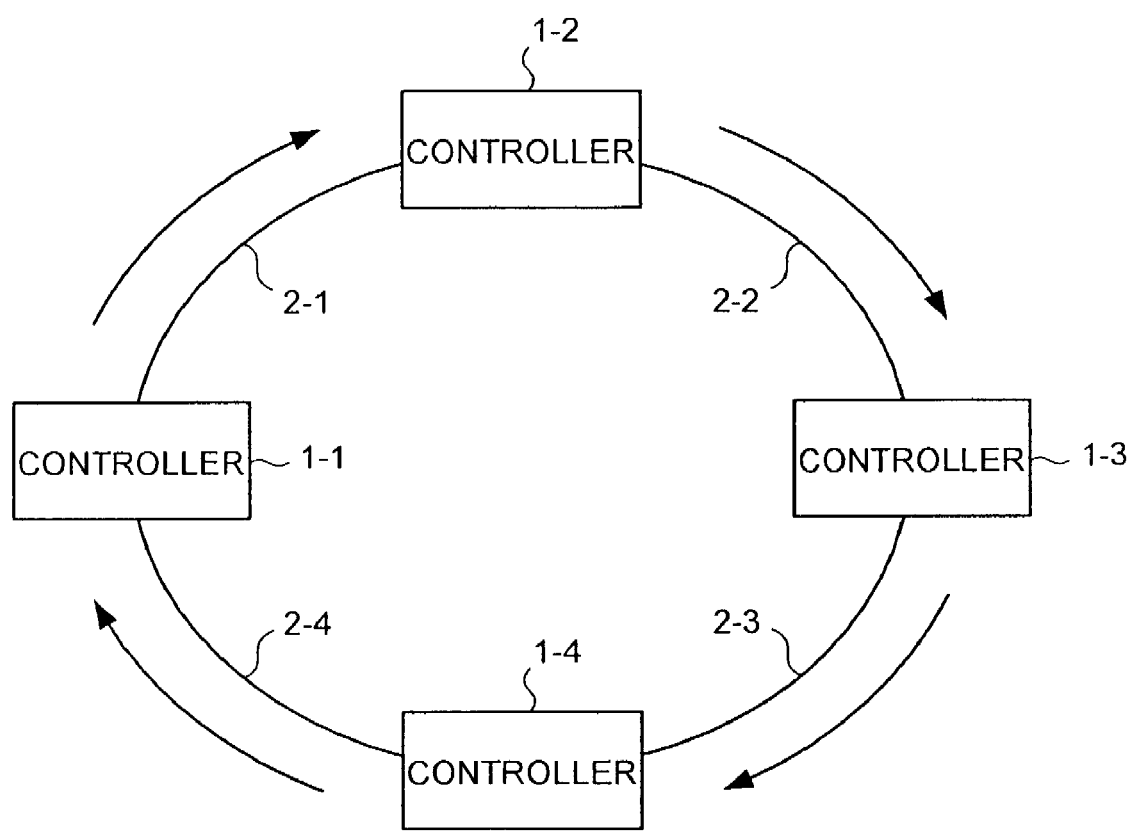
FIG. 1 is a schematic diagram of an example of a configuration of a communication system to which a controller according to a first embodiment of the present invention is applied.

1-1, 1-2, 1-3, 1-4, 1a-1, 1a-2, 1a-3, 1a-4 Controller
2-1, 2-2, 2-3, 2-4 Transmission path
3 Maintenance device
4 Cable
11 Terminal operating unit
12 Switching unit
21 CRC calculating unit
22 DCS checking unit
23 FCS checking unit
24 Address storing unit
25 Frame switching unit
26 Buffer 27 FCS converting unit
29 Error frame counter
30 Alignment-error detecting unit
31 Dummy-data creating unit
32 DCS/FCS converting unit
33 Alignment error counter
50, 60 DA field
51, 61 SA field
52, 62 Type field
53, 63 DATA field
54, 65 FCS field
64 DCS field

BEST MODE(S) FOR CARRYING OUT THE INVENTION

Exemplary embodiments of a communication apparatus and a switching device according to the present invention are explained in detail below with reference to the accompanying drawings. The present invention is not limited to the embodiments.

First Embodiment

A first embodiment of the present invention is explained below with reference to FIGS. 1 to 12. FIG. 1 is a schematic diagram of an example of a configuration of a communication system to which the controller (corresponding to a communication apparatus in claims) according to the first embodiment of the present invention is applied. As shown in FIG. 1, the communication system is a ring-shaped network, and includes a plurality (in this case, four numbers) of controllers 1-1 to 1-4. The controller 1-1 transmits a frame to the controller 1-2 via a transmission path 2-1. The controller 1-2 transmits a frame to the controller 1-3 via a transmission path 2-2. The controller 1-3 transmits a frame to the controller 1-4 via a transmission path 2-3. The controller 1-4 transmits a frame to the controller 1-1 via a transmission path 2-4.

Figure 2:
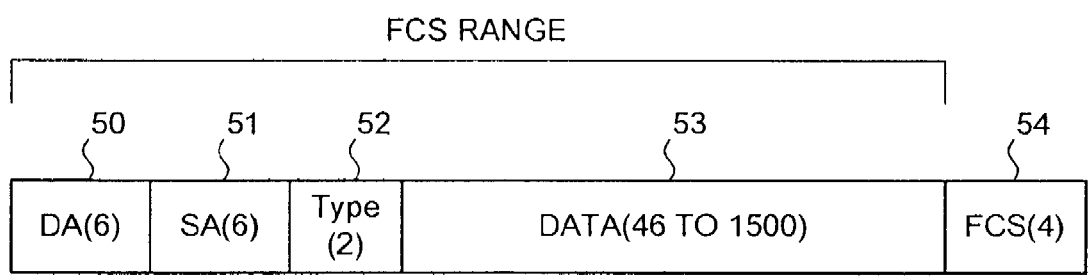
FIG. 2 is a schematic diagram of a configuration of an Ethernet (registered trademark) frame.

FIG. 2 is a schematic diagram of a configuration of a typical Ethernet (registered trademark) frame (hereinafter, referred to as "a layer 2 frame"). As shown in FIG. 2, the layer 2 frame includes a 6-byte destination address (hereinafter, referred to as "DA") field 50 in which a destination address is stored, a 6-byte source address (hereinafter, referred to as "SA") field 51 in which a source address is stored, a 2-byte Type ("Type" in the drawing) field 52 in which a frame type is stored, a 46-to-1500-byte DATA field 53 in which user data is stored, and a 4-byte frame check sequence (hereinafter, referred to as "FCS") field 54 in which a code for an error detection (a CRC calculated value) is stored.

Figure 3:
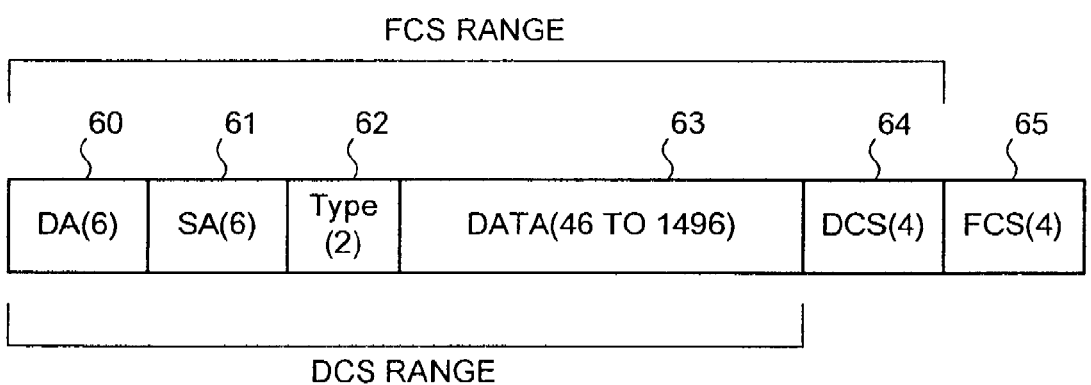
FIG. 3 is a schematic diagram of a configuration of a frame used by the controller according to the first embodiment of the present invention.

FIG. 3 is a schematic diagram of a configuration of a frame used by the controllers 1-1 to 1-4 according to the first embodiment of the present invention. As shown in FIG. 3, the frame includes a 6-byte destination address (hereinafter, referred to as "DA") field 60 in which a destination address is stored, a 6-byte source address (hereinafter, referred to as "SA") field 61 in which a source address is stored, a 2-byte Type ("Type" in the drawing) field 62 in which a frame type is stored, a 46-to-1496-byte DATA field 63 in which user data is stored, a 4-byte data check sequence (hereinafter, referred to as "DCS") field 64 in which a code for an error detection (a CRC calculated value) is stored, and a 4-byte frame check sequence (hereinafter, referred to as "FCS") field 65 in which a code for an error detection (a CRC calculated value) is stored.

In this case, the field denotes a storage location of data to be stored in the frame, and the code denotes a value that the fields indicated in the frame are divided by a specific bit string (a generator polynomial) and obtained by use of an exclusive OR operation.

As can be seen from FIGS. 2 and 3, in the frame used in the communication apparatus according to the first embodiment of the present invention, a portion (4-byte) of the DATA field 53 where the user data is stored in the layer 2 frame is allocated to the DCS field 64. In the DCS field 64, a CRC calculated value for the range from the DA field 60 to the DATA field 63 is stored. In the FCS field 65, a CRC calculated value for the range from the DA field 60 to the DCS field 64 (corresponding to the range from the DA field 50 to the DATA field 53 in the layer 2 frame) is stored.

Figure 4:
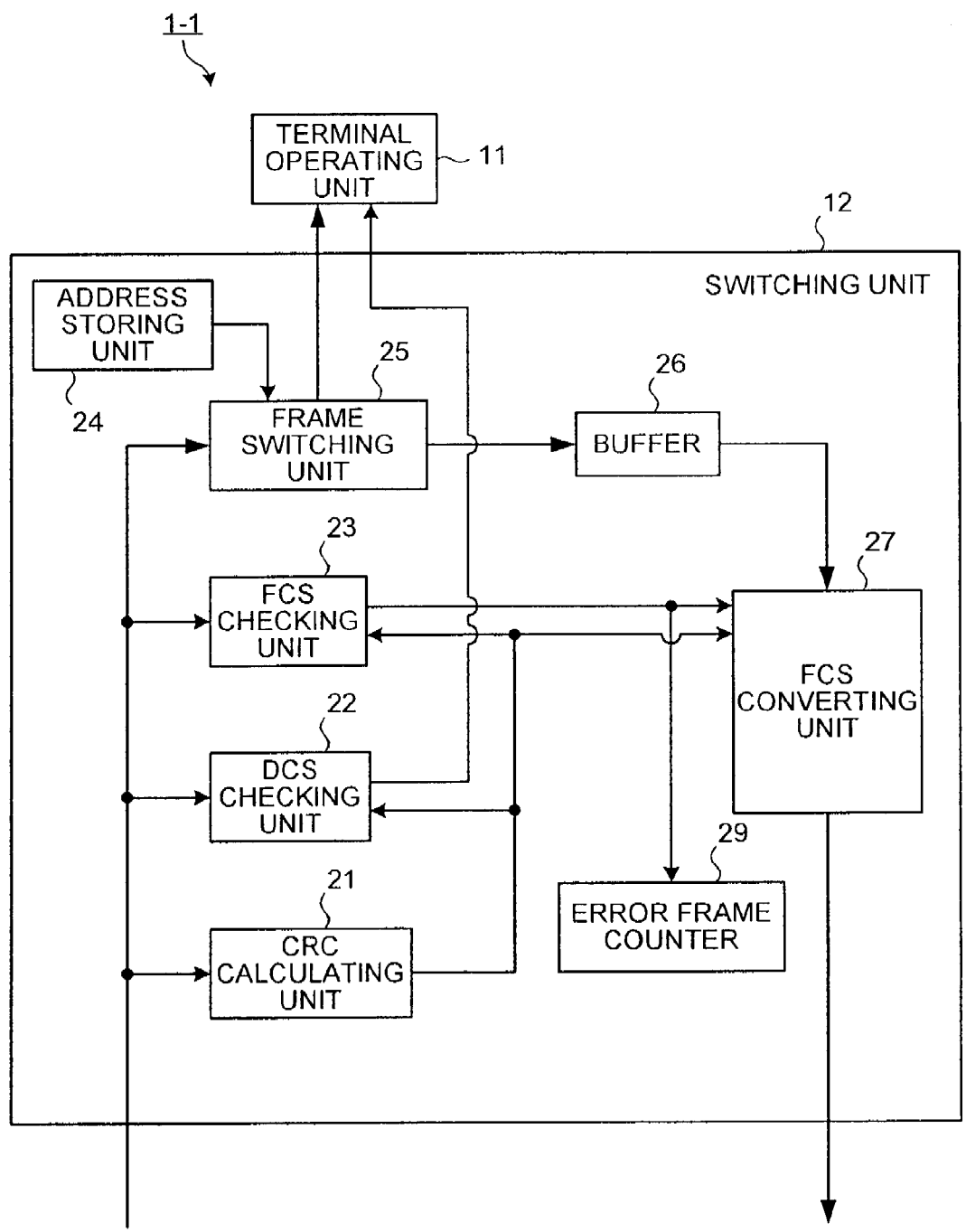
FIG. 4 is a block diagram of a configuration of the controller according to the first embodiment of the present invention.

All the controllers 1-1 to 1-4 shown in FIG. 1 have the same function. The function of the controllers is explained below with reference to a configuration of the controller 1-1 shown in FIG. 4. As shown in FIG. 4, the controller 1-1 includes a switching unit 12 and a terminal operating unit 11. The switching unit 12 includes a CRC calculating unit 21, a DCS checking unit 22, an FCS checking unit 23, an address storing unit 24, a frame switching unit 25, a buffer 26, an FCS converting unit 27, and an error frame counter 29.

As for the switching unit 12, only a portion of a forwarding process for forwarding a frame received from the controller 1-4 via the transmission path 2-4 to the controller 1-2 via the transmission path 2-1 is explained below.

The CRC calculating unit 21 calculates a CRC calculated value of the frame received from the transmission path 2-4. The DCS checking unit 22 checks whether any error occurs in the range from the DA field 60 to the DATA field 63 by comparing a result of the CRC calculation for the range from the DA field 60 to the DATA field 63 calculated by the CRC calculating unit 21 with the CRC calculated value stored in the DCS field 64.

The FCS checking unit 23 checks whether any error occurs in the range from the DA field 60 to the DCS field 64, i.e., whether any error occurs in the entire frame by comparing a result of the CRC calculation for the range from the DA field 60 to the DCS field 64 calculated by the CRC calculating unit 21 with the CRC calculated value stored in the FCS field 65.

The address storing unit 24 stores therein an address of the local controller that is assigned thereto in advance. If the address stored in the SA field 61 is matched with the address of the local controller stored in the address storing unit 24, the frame switching unit 25 outputs the frame to the terminal operating unit 11. If the address stored in the SA field 61 is not matched with the address of the local controller stored in the address storing unit 24, the frame switching unit 25 makes a copy of the frame, and outputs each of the frames to the terminal operating unit 11 and the buffer 26 respectively.

The buffer 26 employs a FIFO (first-in, first-out) method, and outputs the frame received from the frame switching unit 25 to the FCS converting unit 27 with a predetermined time delay. The predetermined time indicates a time period from when the reception of the frame from the transmission path 2-4 is completed to when the FCS converting unit 27 obtains a result of the FCS check checked by the FCS checking unit 23 and the CRC calculated value calculated by the CRC calculating unit 21. Therefore, a time required for forwarding the frame, i.e., a time period from when the controller 1-1 starts receiving the frame from the transmission path 2-4 to when the controller 1-1 outputs the frame to the transmission path 2-1 is referred to as a delay time corresponding to a few bytes (i.e., it indicates not a store-and-forward method but a cut-through method).

Figure 5:
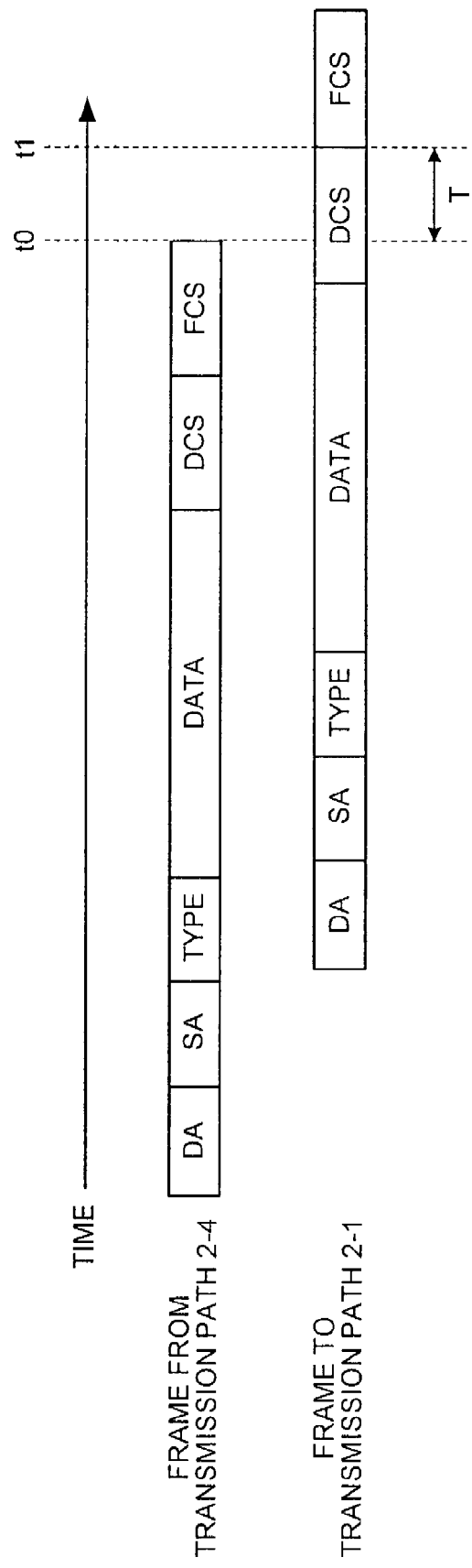
FIG. 5 is a schematic diagram for explaining a delay time for a frame forwarding process performed by the controller according to the first embodiment of the present invention.

FIG. 5 indicates such a condition that the frame input from the transmission path 2-4 is repeated and output to the transmission path 2-1 by the controller 1-1. The buffer 26 outputs the frame received from the frame switching unit 25 to the FCS converting unit 27 with a predetermine time T delay. The time T indicates a time period from a time point t0 when the reception of the frame from the transmission path 2-4 is completed to a time point t1 when it can be ready for performing a process of transmitting the frame to the transmission path 2-1 after the FCS converting unit 27 obtains a result of the check (a result of the FCS check) by the FCS checking unit 23 and a result of the CRC calculation by the CRC calculating unit 21, and changes the CRC calculated value stored in the FCS field 65 of the received frame if necessary.

The FCS converting unit 27 determines whether to change the CRC calculated value stored in the FCS field 65 of the frame received from the buffer 26 based on the result of the FCS check by the FCS checking unit 23. In the result of the determination, if the CRC calculated value is changed, the frame in which the CRC calculated value stored in the FCS field 65 is replaced by the result of the CRC calculation for the range from the DA field 60 to the DCS field 64 calculated by the CRC calculating unit 21 is transmitted to the transmission path 2-1. In the result of the determination, if the CRC calculated value is not changed, the frame received from the buffer 26 is output to the transmission path 2-1 without any change.

The error frame counter 29 counts the number of received frames that are determined as an error based on the result of the FCS check by the FCS checking unit 23.

The terminal operating unit 11 performs a process of receiving the frame input from the frame switching unit 25 based on a result of the check (a result of the DCS check) by the DCS checking unit 22, and creates a frame in which the local controller is set as a source, and transmits the created frame to the transmission path 2-1 via a transmission processing unit (not shown).

FIG. 6 is a schematic diagram for explaining processes performed by the FCS converting unit 27, the error frame counter 29, and the terminal operating unit 11 with respect to a result of the DCS check and a result of the FCS check. As shown in FIG. 6, in a case where both the results of the DCS check and the FCS check are "OK (i.e., no error is detected)" (a pattern 1), the FCS converting unit 27 does not change the CRC calculated value stored in the FCS field 65, and the error frame counter 29 does not count up, and the terminal operating unit 11 executes normal processing.

In a case where the result of the DCS check is "NG (i.e., an error is detected)" and the result of the FCS check is "OK" (a pattern 2), the FCS converting unit 27 does not change the CRC calculated value stored in the FCS field 65, and the error frame counter 29 does not count up, and the terminal operating unit 11 executes error processing.

In a case where the result of the DCS check is "OK" and the result of the FCS check is "NG" (a pattern 3), the FCS converting unit 27 changes the CRC calculated value stored in the FCS field 65 to the CRC calculated value calculated by the CRC calculating unit 21, and the error frame counter 29 counts up, and the terminal operating unit 11 executes normal processing.

In a case where both the results of the DCS check and the FCS check are "NG" (a pattern 4), the FCS converting unit 27 changes the CRC calculated value stored in the FCS field 65 to the CRC calculated value calculated by the CRC calculating unit 21, and the error frame counter 29 counts up, and the terminal operating unit 11 executes error processing.

Namely, only when the result of the FCS check is an error, the FCS converting unit 27 stores the CRC calculated value for data currently-stored in the range from the DA field 60 to the DCS field 64 in the FCS field 65 of a frame subjected to be transmitted. If no error occurs in the transmission path 2-1, it is controlled not to cause the controller 1-2 subjected to receive the frame subsequently not to detect an error in the frame. When the result of the FCS check is an error, the error frame counter 29 counts up (increments). The terminal operating unit 11 executes error processing only when the result of the DCS check is an error.

Figure 7:
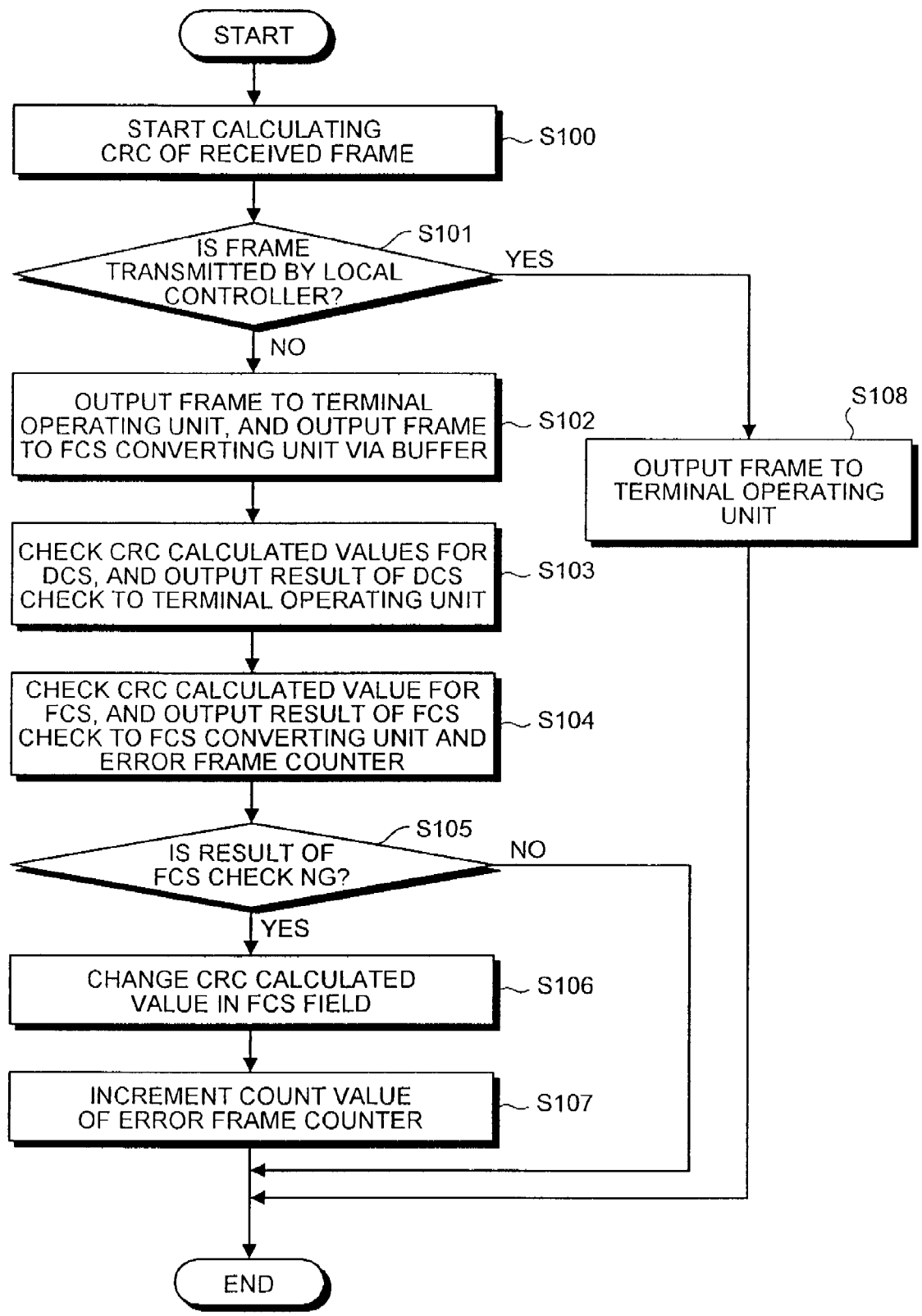
FIG. 7 is a flowchart for explaining an operation of the controller according to the first embodiment of the present invention.

Subsequently, an operation of the controller according to the first embodiment is explained below with reference to a flowchart shown in FIG. 7 by taking the controller 1-1 as an example. Upon receiving a frame via the transmission path 2-4, the CRC calculating unit 21 starts performing a CRC calculation of the received frame (step S100).

The frame switching unit 25 determines whether the received frame is the one transmitted by the local controller (step S101). Specifically, the address of the local controller stored in the address storing unit 24 is compared with the address stored in the SA field 61 of the frame. If the address of the local controller stored in the address storing unit 24 is not matched with the address stored in the SA field 61 of the frame, i.e., if the received frame is not the one transmitted by the local controller but the one transmitted by any one of the controllers 1-2 to 1-4, the frame switching unit 25 makes a copy of the received frame, and outputs one of the frames to the terminal operating unit 11, and outputs the other frame to the FCS converting unit 27 via the buffer 26 (step S102). The FCS converting unit 27 starts forwarding the frame input via the buffer 26.

Upon completion of receiving the DCS field 64 of the frame, the DCS checking unit 22 obtains the CRC calculated value for the range from the DA field 60 to the DATA field 63 calculated by the CRC calculating unit 21. The DCS checking unit 22 checks the CRC calculated value calculated by the CRC calculating unit 21 and the CRC calculated value stored in the DCS field 64 (i.e., determines whether the two values are matched), and outputs a result of the DCS check to the terminal operating unit 11 (step S103).

Upon completion of receiving the FCS field 65 of the frame, the FCS checking unit 23 obtains a result of the CRC calculation for the range from the DA field 60 to the DCS field 64 calculated by the CRC calculating unit 21. The FCS checking unit 23 checks the CRC calculated value calculated by the CRC calculating unit 21 and the CRC calculated value stored in the FCS field 65 (i.e., determines whether the two values are matched), and outputs a result of the FCS check to the FCS converting unit 27 and the error frame counter 29 (step S104).

If the result of the FCS check is mismatching (NG), the FCS converting unit 27 changes the CRC calculated value stored in the FCS field 65 (step S106). Specifically, the CRC calculated value for the range from the DA field 60 to the DCS field 64 calculated by the CRC calculating unit 21 is obtained, and the obtained CRC calculated value is stored in the FCS field 65. Namely, the CRC calculated value for the FCS field 65, i.e., the CRC calculated value for the range from the DA field 60 to the DCS field 64 is stored in the FCS field 65 of the frame subjected to be transmitted to the transmission path 2-1, so that the frame to be received by the subsequent controller 1-2 can be prevented from an occurrence of an error.

Moreover, if the result of the FCS check is mismatching, the error frame counter 29 increments the count value (step S107).

If the result of the FCS check is matching (OK), the frame transmitted by the controller 1-4 is properly received, so that the FCS converting unit 27 forwards the frame to the transmission path 2-1 without changing the CRC calculated value stored in the FCS field 65, and the error frame counter 29 does not change.

On the other hand, if the address of the local controller stored in the address storing unit 24 is matched with the address stored in the SA field 61 of the frame, i.e., if the received frame is the one transmitted by the local controller, the frame switching unit 25 recognizes that the received frame is the one transmitted by the local controller and also that the frame is received by all the controllers 1-2 to 1-4 included in the ring-shaped network, and outputs the frame to the terminal operating unit 11 (step S108).

While the switching unit 12 executes the above operation, the terminal operating unit 11 performs a process of receiving the frame input from the switching unit 12 based on the result of the DCS check input from the DCS checking unit 22. Specifically, as explained above with reference to FIG. 6, if the result of the DCS check is "OK", the terminal operating unit 11 executes normal processing, and if the result of the DCS check is "NG", the terminal operating unit 11 executes error processing.

In a case where the terminal operating unit 11 executes normal processing, if the address stored in the SA field 61 is identical to the address of the local controller, the terminal operating unit 11 determines that the frame transmitted by the local controller is recognized by the other controllers 1-2 to 1-4, conversely, if the address stored in the SA field 61 is not identical to the address of the local controller, the terminal operating unit 11 recognizes the frame as a notification from any of the other controllers 1-2 to 1-4, and performs a predetermined process based on a command and a data value those stored in the DATA field 63.

In a case where the terminal operating unit 11 executes error processing, the terminal operating unit 11 performs a predetermined process, for example, the terminal operating unit 11 creates a frame for notifying the occurrence of the error to the other controllers 1-2 to 1-4, and transmits the created frame to the other controllers 1-2 to 1-4.

Subsequently, an operation of the communication system in a case where an error occurs in the transmission path is explained below with reference to FIGS. 8 to 11. It is assumed that the count value of the error frame counter 29 of each of the controllers 1-1 to 1-4 is a default value (in this case, at zero).

Figure 8:
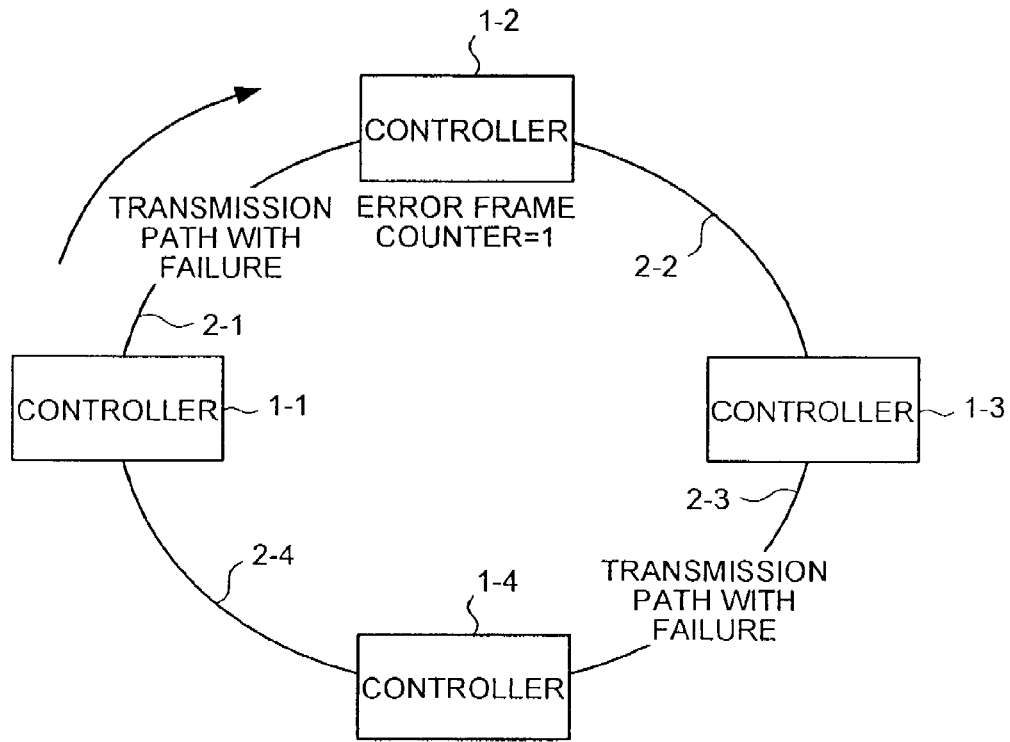
FIG. 8 is a schematic diagram for explaining an operation of the communication system according to the first embodiment of the present invention.

As shown in FIG. 8, it is assumed that errors occur in the transmission paths 2-1 and 2-3. The controller 1-1 creates a frame that addresses of the controllers 1-2 to 1-4 as destinations are stored in the DA field 60, an address of the local controller is stored in the SA field 61, a frame length is stored in the Type field 62, user data is stored in the DATA field 63, a CRC calculated value for data stored in the range from the DA field 60 to the DATA field 63 is stored in the DCS field 64, and a CRC calculated value for data stored in the range from the DA field 60 to the DCS field 64 is stored in the FCS field 65, and transmits the created frame to the transmission path 2-1.

Due to the occurrence of the error in the transmission path 2-1, data in the frame transmitted by the controller 1-1 is garbled. Therefore, in the controller 1-2, a result of the DCS check by the DCS checking unit 22 and a result of the FCS check by the FCS checking unit 23 are "NG" (the pattern 4 shown in FIG. 6).

Consequently, the FCS converting unit 27 stores a CRC calculated value for the range from the DA field 60 to the DCS field 64 of the received frame in the FCS field 65 of a frame subjected to be transmitted. The error frame counter 29 increments the count value by one. The terminal operating unit 11 executes error processing because the result of the DCS check is "NG".

Then, the frame is forwarded to the controller 1-3 via the transmission path 2-2 by the controller 1-2. As no error occurs in the transmission path 2-2, data in the frame transmitted by the controller 1-2 is not garbled. Therefore, in the controller 1-3, a result of the FCS check by the FCS checking unit 23 is "OK". However, the data stored in the range from the DA field 60 to the DCS field 64 of the frame transmitted by the controller 1-1 is garbled due to the error in the transmission path 2-1. Therefore, in the controller 1-3, a result of the DCS check by the DCS checking unit 22 is "NG". That is the case of the pattern 2 shown in FIG. 6.

Figure 9:
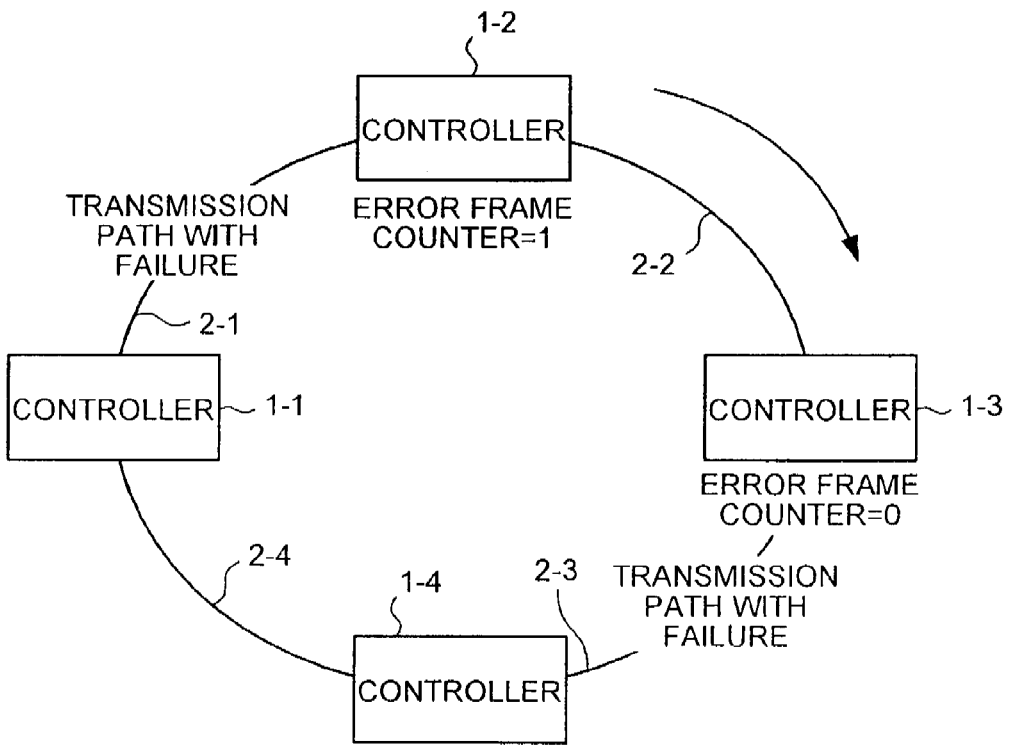
FIG. 9 is a schematic diagram for explaining the operation of the communication system according to the first embodiment of the present invention.

Consequently, the FCS converting unit 27 does not change the FCS field 65 of the frame to be transmitted. As shown in FIG. 9, the error frame counter 29 does not increment the count value, so that the count value remains at zero. The terminal operating unit 11 executes error processing because the result of the DCS check is "NG".

Then, the frame is forwarded to the controller 1-4 via the transmission path 2-3 by the controller 1-3. Due to the occurrence of the error in the transmission path 2-3, data in the frame transmitted by the controller 1-3 is garbled. Therefore, in the controller 1-4, both a result of the DCS check by the DCS checking unit 22 and a result of the FCS check by the FCS checking unit 23 are "NG" (the pattern 4 shown in FIG. 6).

Figure 10:
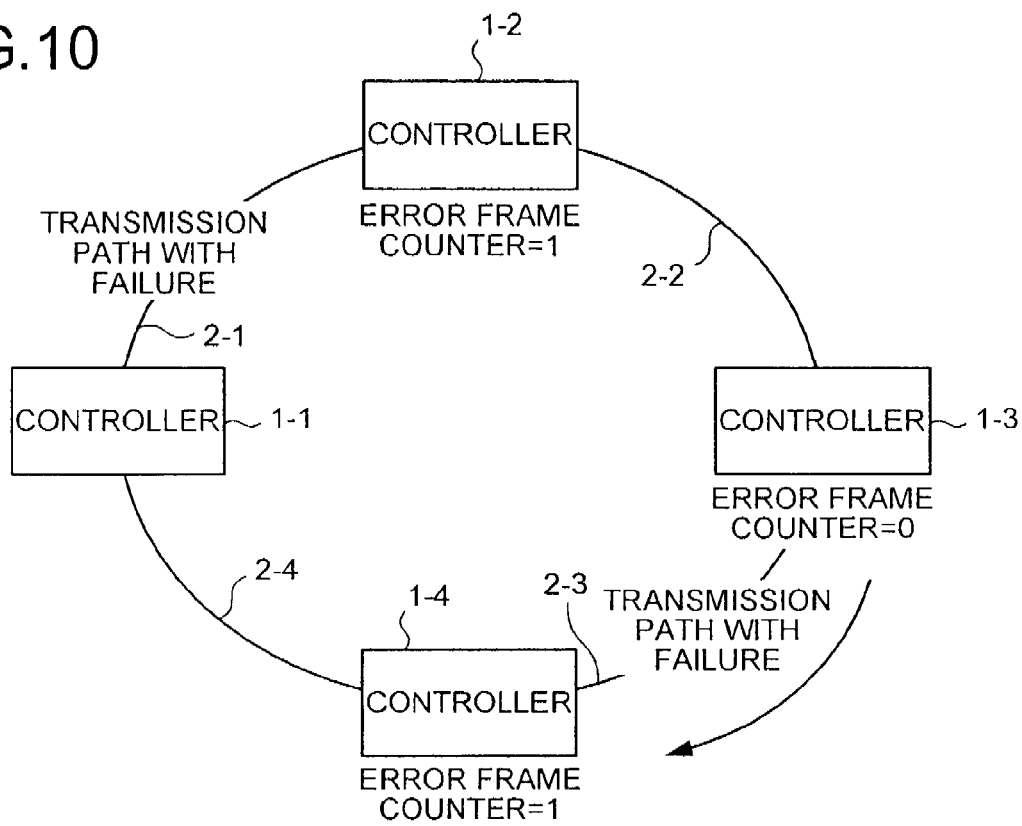
FIG. 10 is a schematic diagram for explaining the operation of the communication system according to the first embodiment of the present invention.

Consequently, the FCS converting unit 27 stores a CRC calculated value for the range from the DA field 60 to the DCS field 64 of the received frame in the FCS field 65 of a frame subjected to be transmitted. As shown in FIG. 10, the error frame counter 29 increments the count value by one. The terminal operating unit 11 executes error processing because the result of the DCS check is "NG".

The frame is forwarded to the controller 1-1 via the transmission path 2-4 by the controller 1-4. As no error occurs in the transmission path 2-4, the data in the frame transmitted by the controller 1-4 is not garbled. Therefore, in the controller 1-1, a result of the FCS check by the FCS checking unit 23 is "OK". However, the data stored in the range from the DA field 60 to the DCS field 64 of the frame transmitted by the controller 1-4 is garbled due to the errors in the transmission paths 2-1 and 2-3. Therefore, in the controller 1-1, a result of the DCS check by the DCS checking unit 22 is "NG". That is the case of the pattern 2 shown in FIG. 6.

Figure 11:
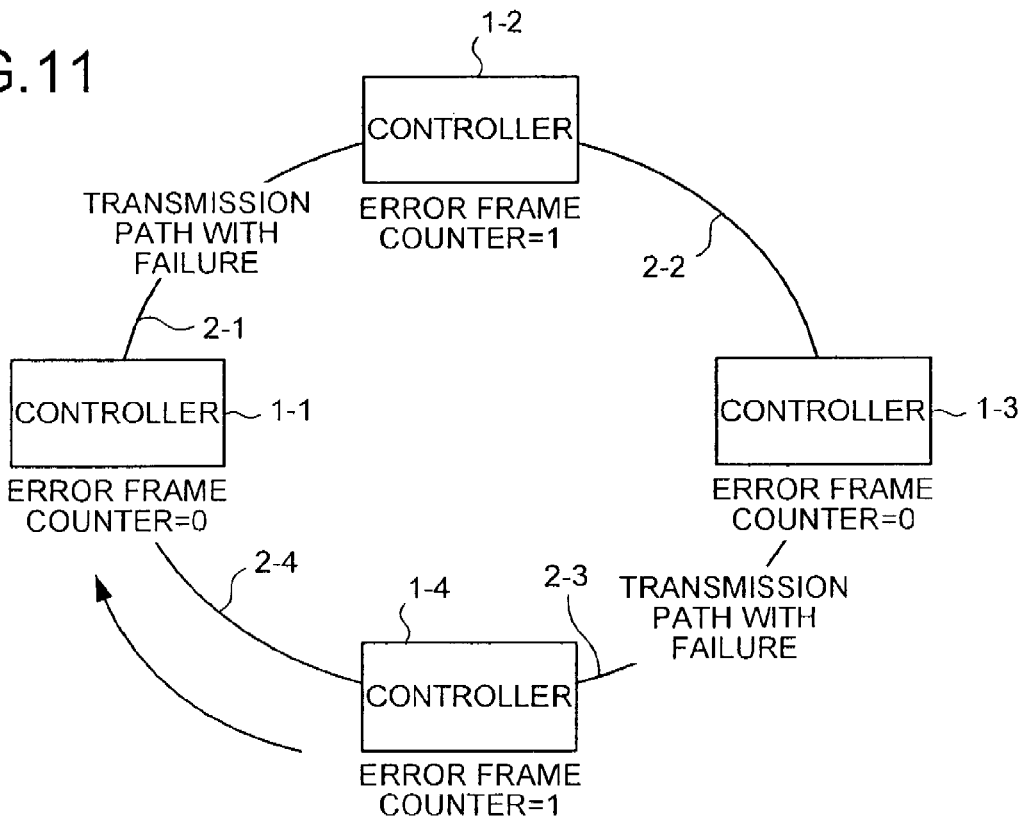
FIG. 11 is a schematic diagram for explaining the operation of the communication system according to the first embodiment of the present invention.

Consequently, the FCS converting unit 27 does not change the FCS field 65 of the frame to be transmitted. As shown in FIG. 11, the error frame counter 29 does not increment the count value, so that the count value remains at zero. The terminal operating unit 11 executes error processing because the result of the DCS check is "NG".

In this manner, while the frame transmitted by the controller 1-1 is circulated among the other controllers 1-2 to 1-4 included in the ring-shaped network, if errors occur in the transmission paths 2-1 and 2-3, only the error frame counters 29 in each of the controllers 1-2 and 1-4, which respectively receive the frame via the transmission paths 2-1 and 2-3 where the errors occur, counts up.

Subsequently, how a condition of the communication system is associated with each pattern of the results of the DCS check and the FCS check shown in FIG. 6 is explained below. In the case of the "pattern 1" shown in FIG. 6, both the results of the DCS check and the FCS check are "OK", so that no error occurs while the frame is forwarded from the source controller to the local controller at all, i.e., no error occurs in the transmission paths connecting from the source controller to the local controller.

In the case of the "pattern 2", the result of the DCS check is "NG" and the result of the FCS check is "OK", so that an error occurs while the frame is forwarded from the source controller to the local controller; however, no error occurs in the transmission path connecting between the local controller and the adjacent controller that forwards the frame to the local controller.

In the case of the "pattern 3", the result of the DCS check is "OK" and the result of the FCS check is "NG", so that an error occurs in the transmission path connecting between the local controller and the adjacent controller that forwards the frame to the local controller; however, data stored in the range from the DA field 60 to the DCS field 64 is not garbled, so that it is possible to process the frame. Namely, data stored in the FCS field 65 only is garbled due to the error in the transmission path.

In the case of the "pattern 3", at the time of forwarding the frame, the CRC calculated value for the range from the DA field 60 to the DCS field 64 of the received frame is stored in the FCS field 65 by the FCS converting unit 27. As a result, the frame can store therein the CRC calculated value properly in the same manner as the frame created by the source controller.

In the case of the "pattern 4", both the results of the DCS check and the FCS check are "NG", so that an error occurs in the transmission path connecting between the local controller and the adjacent controller that forwards the frame to the local controller, or errors occur in the transmission path connecting between the local controller and the adjacent controller that forwards the frame to the local controller and between the source controller and the adjacent controller that forwards the frame to the local controller.

Figure 12:
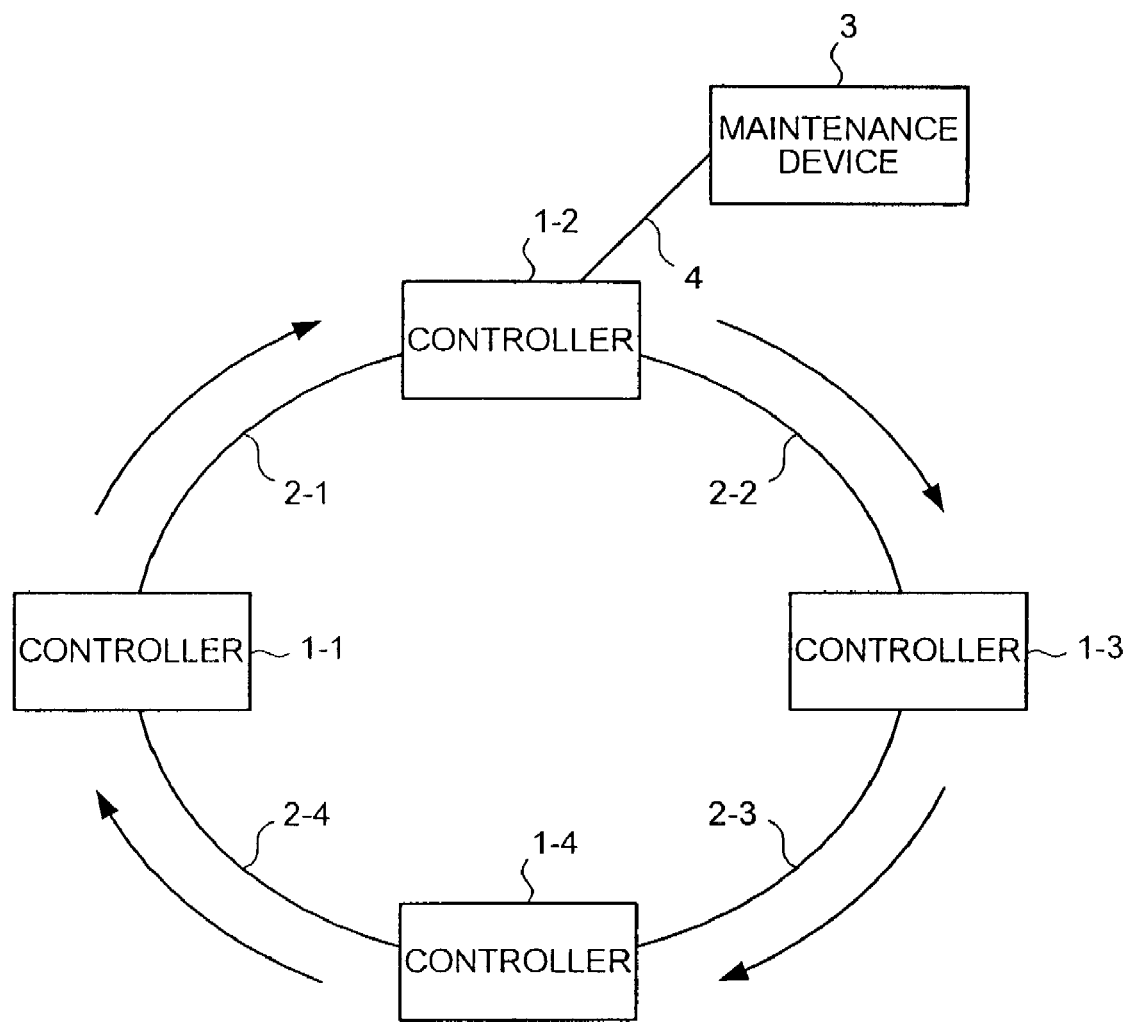
FIG. 12 is a schematic diagram of another example of the configuration of the communication system to which the controller according to the first embodiment of the present invention is applied.

FIG. 12 is a schematic diagram of another example of the configuration of the communication system to which the controller according to the first embodiment of the present invention is applied. The communication system shown in FIG. 12 further includes a maintenance device 3 in addition to that is shown in FIG. 1. The portions identical to those in the communication system shown in FIG. 1 are denoted with the same reference numerals, and the description of those portions is omitted.

The maintenance device 3 is connected to any one of the controllers 1-1 to 1-4 (in this case, the controller 1-2) by a cable 4, and capable of communicating with the controllers 1-1 to 1-4 included in the communication system via the cable 4 and the controller 1-2. The maintenance device 3 acquires the count value of the error frame counter 29 in the controller 1-2 via the cable 4, and also acquires the count values of the error frame counters 29 in the controllers 1-1, 1-3, and 1-4 via the cable 4 and the controller 1-2. The maintenance device 3 displays the acquired count values of the error frame counters 29 in the controllers 1-1 to 1-4 on a display unit (not shown). Incidentally, each of the count values of the error frame counters 29 in the controllers 1-1 to 1-4 can be acquired at predetermined intervals or every time when an input unit (not shown) receives a request for the acquisition from an administrator.

In this manner, the maintenance device 3 is connected to the controller 1-2, so that the administrator can acquire the count values of the error frame counters 29 in the controllers 1-1 to 1-4 without getting to installation sites where the controllers 1-1 to 1-4 included in the communication system are placed, and also identify a failure portion of the transmission paths 2-1 to 2-4.

For example, it is assumed that the communication system is in a state shown in FIG. 11. The maintenance device 3 displays that the count value of the error frame counter 29 in the controller 1-1 is "zero", the count value of the error frame counter 29 in the controller 1-2 is "one", the count value of the error frame counter 29 in the controller 1-3 is "zero", and the count value of the error frame counter 29 in the controller 1-4 is "one". Therefore, the administrator can identify that errors occur in the transmission path 2-1 between the controllers 1-1 and 1-2 and the transmission path 2-3 between the controllers 1-3 and 1-4.

As described above, according to the first embodiment, at the time of receiving a frame including the DA field 60 in which a destination address is stored; the SA field 61 in which a source address is stored; the Type field 62 in which a frame length is stored; the DATA field 63 in which user data subjected to be transmitted is stored; the DCS field 64 in which a CRC calculated value as a check code used for an error detection of data stored in the DA field 60, the SA field 61, the Type field 62, and the DATA field 63 is stored; and the FCS field 65 in which a CRC calculated value as a check code used for an error detection of data stored in the DA field 60, the SA field 61, the Type field 62, the DATA field 63, and the DCS field 64 is stored, the CRC calculating unit 21 performs a CRC calculation from a head of the received frame to obtain a CRC calculated value for the range from the DA field 60 to the DATA field 63 and a CRC calculated value for the range from the DA field 60 to the DCS field 64, and the DCS checking unit 22 compares the obtained CRC calculated value for the range from the DA field 60 to the DATA field 63 with the CRC calculated value stored in the DCS field 64, and outputs a result of the comparison as a result of a DCS check to the terminal operating unit 11, and the FCS checking unit 23 compares the obtained CRC calculated value for the range from the DA field 60 to the DCS field 64 with the CRC calculated value stored in the FCS field 65, and outputs a result of the comparison as a result of an FCS check to the FCS converting unit 27, and the FCS checking unit 23 forwards the received frame without any change if the result of the FCS check is matching, and forwards a frame that the calculated FCS code is stored in the FCS field 65 of the received frame if the result of the FCS check is mismatching, and the error frame counter 29 counts the number of frames that the result of the FCS check is mismatching, and then the terminal operating unit 11 performs a normal receiving process if the result of the DCS check is matching, and executes error processing if the result of the DCS check is mismatching. Therefore, it is possible to recognize the validity of data in the frame and any occurrence of failure in the transmission paths. Consequently, even in a case of using the cut-through switching method, it is possible to identify a failure portion of the transmission paths without circulating an error frame in the network.

According to the first embodiment, to concentrate functions for calculating an FCS code and a DCS code of the received frame on the CRC calculating unit 21, a range subject to the DCS code calculation is the DA field 60, the SA field 61, the Type field 62, and the DATA field 63. Alternatively, the CRC calculating unit 21 can be separated into an FCS-code calculating unit and a DCS-code calculating unit. In this case, the range subject to the DCS code calculation can be the DATA field 63 only.

Instead of the CRC calculated value, the DCS-code calculating unit can use other calculated values for an error detection of data, such as a sum value.

Second Embodiment

Figure 13:
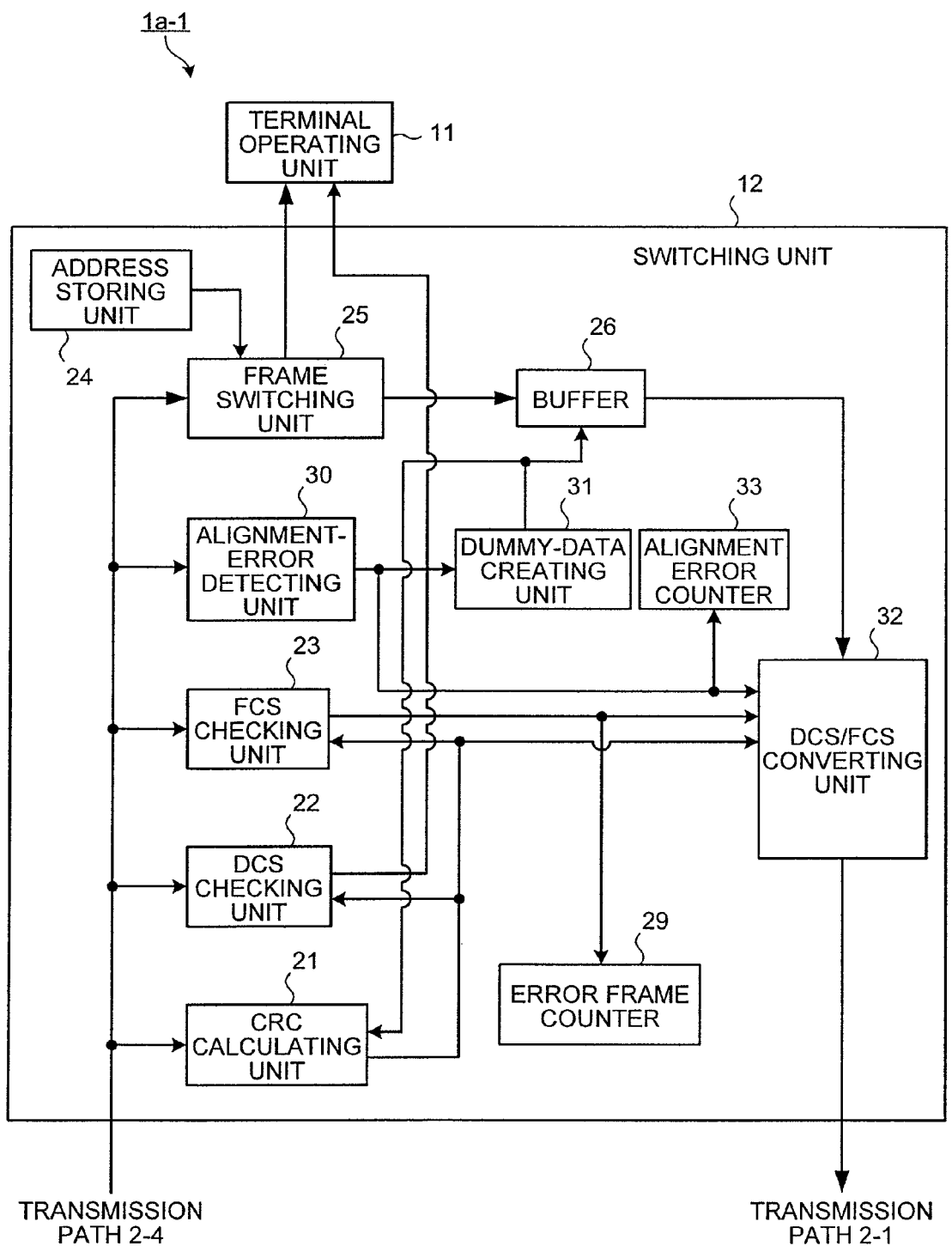
FIG. 13 is a block diagram of a configuration of a controller according to a second embodiment of the present invention.
Figure 14:
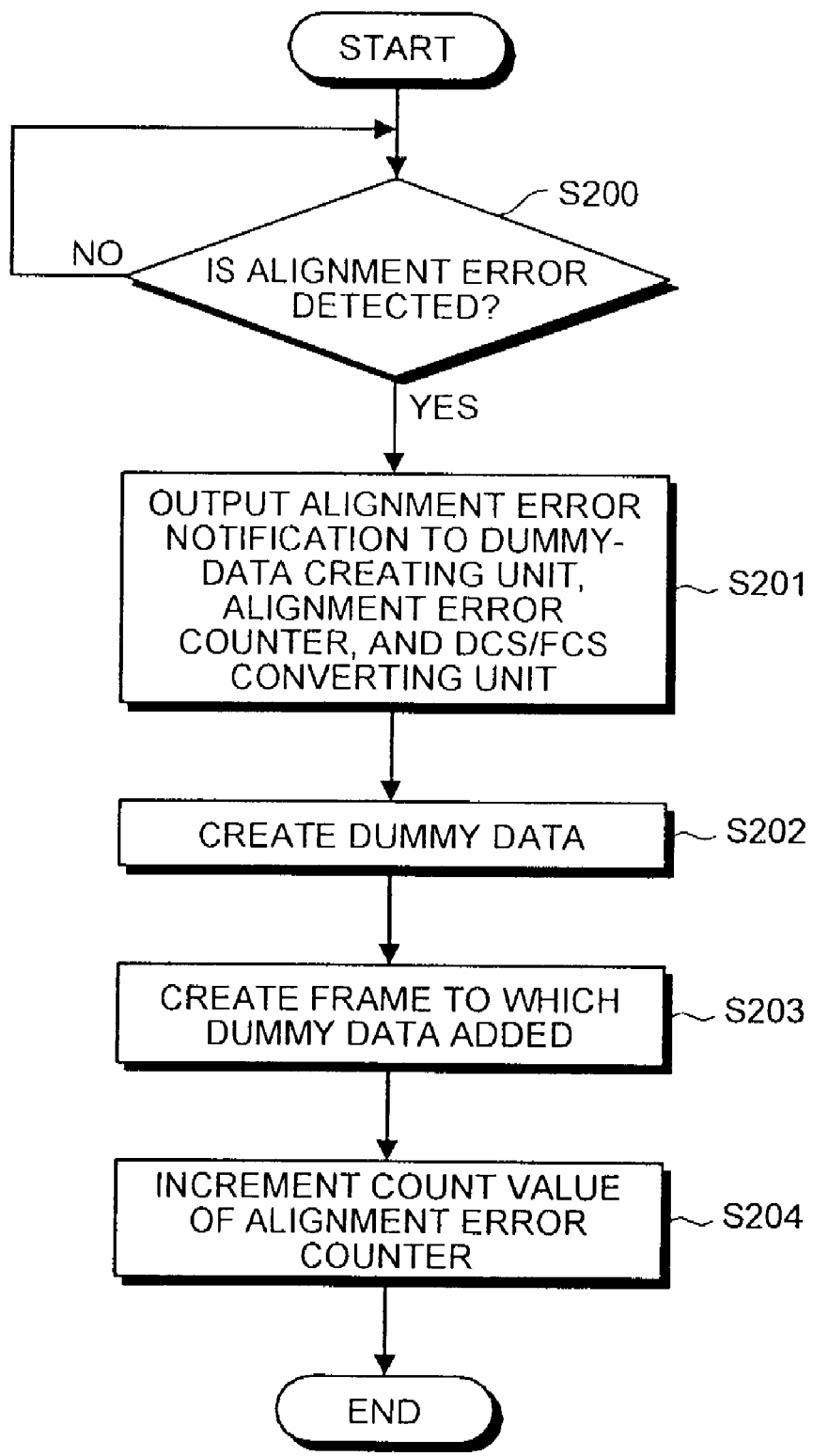
FIG. 14 is a flowchart for explaining an operation of the controller according to the second embodiment of the present invention.

A second embodiment of the present invention is explained below with reference to FIGS. 13 and 14. In first embodiment, the case where data in the frame is garbled due to the failure in the transmission path is explained. However, the error caused by the failure in the transmission path is not limited to the garbled data. For example, there is a case where a portion of the frame is lacked, i.e., although the frame is generally composed of byte-unit fields, in some cases, a frame having a byte-unit fraction (a frame in which an alignment error is caused) is received. The communication apparatus according to the second embodiment copes with the alignment error.

A controller, as the communication apparatus according to the second embodiment of the present invention, is applied to a communication system. The communication system includes controllers 1a-1 to 1a-4 instead of the controllers 1-1 to 1-4 included in the communication system shown in FIG. 1.

All the controllers 1a-1 to 1a-4 have the same function. The function of the controllers according to the second embodiment is explained below with reference to a block diagram of a configuration of the controller 1a-1 shown in FIG. 13. The controller 1a-1 shown in FIG. 13 differs from the controller 1-1 according to the first embodiment shown in FIG. 4 in that the controller 1a-1 includes a DCS/FCS converting unit 32 (corresponding to an FCS converting unit in claims) instead of the FCS converting unit 27, and further includes an alignment-error detecting unit 30, a dummy-data creating unit 31, and an alignment error counter 33. The portions identical to those in the controller 1-1 according to the first embodiment are denoted with the same reference numerals, and the description of those portions is omitted.

The alignment-error detecting unit 30 detects a frame length of the received frame, and determines whether an alignment error occurs in the frame. If the alignment error is detected, the alignment-error detecting unit 30 outputs an alignment error notification to the dummy-data creating unit 31, the alignment error counter 33, and the DCS/FCS converting unit 32. The alignment error notification to be output to the dummy-data creating unit 31 includes a data length of the lacked portion.

Upon receiving the alignment error notification, the dummy-data creating unit 31 creates dummy data having the data length indicated in the alignment error notification. The dummy-data creating unit 31 outputs the created dummy data to the buffer 26 and the CRC calculating unit 21.

Upon receiving the alignment error notification, the DCS/FCS converting unit 32 stores a turnover value of the CRC calculated value for the range from the DA field 60 to the DATA field 63 (the CRC calculated value for data that the dummy data created by the dummy-data creating unit 31 is added to the received frame), which is calculated by the CRC calculating unit 21, in the DCS field 64, in addition to the same operation as the FCS converting unit 27 according to the first embodiment.

Upon receiving the alignment error notification, the alignment error counter 33 increments the count value, and counts the number of occurrences of the alignment error.

Subsequently, an operation of the controller according to the second embodiment is explained with taking the controller 1a-1 as an example. In a case where no alignment error occurs, an operation of the controller 1a-1 is identical to that is of the controller 1-1 according to the first embodiment as explained above with reference to the flowchart shown in FIG. 7, except the operation of the FCS converting unit 27 is performed by the DCS/FCS converting unit 32, so that the description of the operation is omitted.

An operation of the controller 1a-1 in a case where an alignment error occurs is explained below with reference to a flowchart shown in FIG. 14. The alignment-error detecting unit 30 monitors a data length of a frame received via the transmission path 2-4. When an alignment error is detected in the received frame (i.e., when a byte-unit fraction is detected in the frame), the alignment-error detecting unit 30 outputs an alignment error notification to the dummy-data creating unit 31, the alignment error counter 33, and the DCS/FCS converting unit 32 (steps S200 and S201).

Upon receiving the alignment error notification, the dummy-data creating unit 31 creates dummy data having a data length indicated in the alignment error notification (step S202). The dummy-data creating unit 31 outputs the created dummy data to the buffer 26 and the CRC calculating unit 21.

The CRC calculating unit 21 performs a CRC calculation of data that the received frame and the dummy data input from the dummy-data creating unit 31 as well, as subject data to the CRC calculation, and notifies the DCS/FCS converting unit 32 of the calculated CRC calculated value.

Upon receiving the dummy data created by the dummy-data creating unit 31 via the buffer 26, the DCS/FCS converting unit 32 creates a frame in which the dummy data, as data for filling the lacked portion, is added to the received frame (step S203). The DCS/FCS converting unit 32 transmits the created frame to the transmission path 2-1.

At this time, the DCS/FCS converting unit 32 stores a turnover value of the CRC calculated value for data corresponding to the DA field 60 to the DATA field 63, which is notified by the CRC calculating unit 21, in the DCS field 64. In other words, a CRC calculated value that makes a result of the DCS check in the controller 1a-2 subjected to receive the forwarded frame "NG" is stored in the DCS field 64.

The DCS/FCS converting unit 32 further stores the CRC calculated value for data corresponding to the DA field 60 to the DCS field 64, which is notified by the CRC calculating unit 21, in the FCS field 65. In other words, the CRC calculated value that makes a result of the FCS check in the controller 1a-2 subjected to receive the forwarded frame "OK" is stored in the FCS field 65.

Upon receiving the alignment error notification, the alignment error counter 33 increments the count value (step S204).

As described above, according to the second embodiment, the alignment-error detecting unit 30 monitors a frame length of a received frame to detect an alignment error. If an alignment error is detected in the received frame, the dummy-data creating unit 31 creates dummy data corresponding to a lacked portion of the received frame. The DCS/FCS converting unit 32 creates a frame in which the dummy data is added to the received frame, and forwards the created frame by storing a turnover value of the CRC calculated value for the range from the DA field 60 to the DATA field 63 calculated by the CRC calculating unit 21 in the DCS field 64 and also storing the CRC calculated value for the range from the DA field 60 to the DCS field 64 in the FCS field 65. Therefore, even when an alignment error occurs once, if no error occurs in the transmission path, it is possible to prevent an occurrence of the alignment error in the subsequent communication apparatus, and also to recognize the validity of data in the frame and any error occurrence in the transmission paths.

Consequently, even in a case of using the cut-through switching method, it is possible to identify a failure portion of the transmission paths without circulating an error frame in the network.

In the second embodiment, the alignment error is taken as an example, and explained above. It is obvious that the communication apparatus can cope with other frame failures such as a frame in which a portion of data is cut off due to an excess data length.

In a case where the controllers 1a-1 to 1a-4 according to the second embodiment are applied to the communication system including the maintenance device 3 as shown in FIG. 12, it is obvious that the maintenance device 3 can acquire not only the count values of the error frame counters 29 but also the count value of the alignment error counter 33.

According to the first and second embodiments, the terminal operating unit 11 and the switching unit 12 are included in each of the controllers 1-1 to 1-4 and 1a-1 to 1a-4. Instead of the terminal operating unit 11 and the switching unit 12, the communication system can include a terminal operating device and a switching device as independent devices.

INDUSTRIAL APPLICABILITY

As described above, the communication apparatus and the switching device according to the present invention are useful for a communication system required to have performances in real-time processing and maintenances, and particularly suitable for an industrial network system.

The invention claimed is:

1. A communication apparatus comprising:
a terminal operating unit that performs a process of receiving a frame; and
a switching unit that outputs a received frame to the terminal operating unit, and forwards the received frame by a cut-through method, wherein
the frame includes
a destination address (DA) field in which a destination address is stored;
a source address (SA) field in which a source address is stored;
a type field in which a frame length is stored;
a user data field in which user data subjected to be transmitted is stored; and
a frame check sequence (FCS) field in which an FCS code as a check code used for an error detection of data stored in the DA field, the SA field, the Type field, and the user data field is stored,
the user data field includes a DATA field in which the user data is stored, the DA field, the SA field, the type field, and
a data check sequence (DCS) field in which a DCS code as a check code used for an error detection of data stored in the DATA field is stored,
the switching unit includes
a code calculating unit that performs a predetermined calculation from a head of the received frame, and calculates a DCS code based on data stored in the DA field, the SA field, the Type field, and the DATA field and an FCS code based on data stored in the DA field, the SA field, the Type field, the DATA field, and the DCS field;
a DCS checking unit that compares the DCS code calculated by the code calculating unit with the DCS code stored in the DCS field of the received frame, and outputs a result of a comparison as a result of a DCS check to the terminal operating unit;

an FCS checking unit that compares the FCS code calculated by the code calculating unit with the FCS code stored in the FCS field of the received frame, and outputs a result of a comparison as a result of an FCS check;
an FCS converting unit that forwards the received frame without any change if the result of the FCS check is matching, and forwards a frame that the calculated FCS code is stored in the FCS field of the received frame if the result of the FCS check is mismatching; and
an error frame counter that increments if the result of the FCS check is mismatching, and
the terminal operating unit executes normal processing based on a frame input from the switching unit if the result of the DCS check is matching, and executes error processing if the result of the DCS check is mismatching.

2. The communication apparatus according to claim 1, wherein
a cyclic redundancy check (CRC) code is used as the DCS code and the FCS code, and
the code calculating unit performs a CRC calculation as the predetermined calculation.

3. A communication apparatus comprising:
a terminal operating unit that performs a process of receiving a frame; and
a switching unit that outputs a received frame to the terminal operating unit, and forwards the received frame by a cut-through method, wherein
the frame includes
a destination-address (DA) field in which a destination address is stored;
a source-address (SA) field in which a source address is stored;
a Type field in which a frame length is stored;
a DATA field in which user data subjected to be transmitted is stored;
a data check sequence (DCS) field in which a DCS code as a check code used for an error detection of data stored in the DA field, the SA field, the Type field, and the DATA field is stored; and
a frame check sequence (FCS) field in which an FCS code as a check code used for an error detection of data stored in the DA field, the SA field, the Type field, the DATA field, and the DCS field is stored,
the switching unit includes
a code calculating unit that performs a predetermined calculation of the received frame from a head of the frame to calculate a DCS code based on data stored in the DA field, the SA field, the Type field, and the DATA field of the received frame and an FCS code based on data stored in the DA field, the SA field, the Type field, the DATA field, and the DCS field;
a DCS checking unit that compares the DCS code calculated by the code calculating unit with the DCS code stored in the DCS field of the received frame, and outputs a result of a comparison to the terminal operating unit as a result of a DCS check;
an FCS checking unit that compares the FCS code calculated by the code calculating unit with the FCS code stored in the FCS field of the received frame, and outputs a result of a comparison as a result of an FCS check;

an FCS converting unit that forwards the received frame without any change if the result of the FCS check is matching, and forwards a frame that the calculated FCS code is stored in the FCS field of the received frame if the result of the FCS check is mismatching;

an error frame counter that increments if the result of the FCS check is mismatching;

an alignment-error detecting unit that detects an alignment error by monitoring a frame length of the received frame;

a dummy-data creating unit that creates dummy data for filling a lacked portion of the received frame if an alignment error is detected by the alignment-error detecting unit; and an alignment error counter that increments a count value if an alignment error is detected by the alignment-error detecting unit, wherein a cyclic redundancy check calculating unit calculates a data check sequence code and a frame check sequence code using the dummy data created by the dummy-data creating unit, subsequent to the received frame, and the frame check sequence converting unit creates a frame that the dummy data is added to the received frame, and forwards the created frame in which the data check sequence code and the frame check sequence code, which are calculated with the dummy data, are respectively stored in a data check sequence field and a frame check sequence field, and the terminal operating unit executes normal processing based on a frame input from the switching unit if the result of the DCS check is matching, and executes error processing if the result of the DCS check is mismatching.

4. A switching device that receives a frame including a destination address (DA) field in which a destination address is stored; a source address (SA) field in which a source address is stored; a Type field in which a frame length is stored; a user data field in which user data subjected to be transmitted is stored; and a frame check sequence (FCS) field in which an FCS code as a check code used for an error detection of data stored in the DA field, the SA field, the Type field, and the user data field is stored, the user data field including a DATA field in which the user data is stored; the DA field; the SA field; the Type field; and a data check sequence (DCS) field in which a DCS code as a check code used for an error detection of data stored in the DATA field is stored, and outputs a received frame to an external terminal operating device that performs a process of receiving a frame, and also forwards the received frame by a cut-through method, the switching device comprising:

a code calculating unit that performs a predetermined calculation from a head of the received frame, and calculates a DCS code based on data stored in the DA field, the SA field, the Type field, and the DATA field and an FCS code based on data stored in the DA field, the SA field, the Type field, the DATA field, and the DCS field;

a DCS checking unit that compares the DCS code calculated by the code calculating unit with the DCS code stored in the DCS field of the received frame, and outputs a result of a comparison as a result of a DCS check to the terminal operating unit;

an FCS checking unit that compares the FCS code calculated by the code calculating unit with the FCS code stored in the FCS field of the received frame, and outputs a result of a comparison as a result of an FCS check;

an FCS converting unit that forwards the received frame without any change if the result of the FCS check is matching, and forwards a frame that the calculated FCS code is stored in the FCS field of the received frame if the result of the FCS check is mismatching; and an error frame counter that increments if the result of the FCS check is mismatching.

5. The switching device according to claim 4, wherein a cyclic redundancy check (CRC) code is used as the DCS code and the FCS code, and the code calculating unit performs a CRC calculation as the predetermined calculation.

6. A switching device that receives a frame, and outputs a received frame to an external terminal operating device that performs a process of receiving a frame, and forwards the received frame by a cut-through method, the frame including a destination address (DA) field in which a destination address is stored; a source address SA) field in which a source address is stored; a Type field in which a frame length is stored; a DATA field in which user data subjected to be transmitted is stored; a data check sequence (DCS) field in which a DCS code as a check code used for an error detection of data stored in the DA field, the SA field, the Type field, and the DATA field is stored; and a frame check sequence (FCS) field in which an FCS code as a check code used for an error detection of data stored in the DA field, the SA field, the Type field, the DATA field, and the DCS field is stored, the switching device comprising:

a code calculating unit that performs a predetermined calculation of the received frame from a head of the frame to calculate a DCS code based on data stored in the DA field, the SA field, the Type field, and the DATA field of the received frame and an FCS code based on data stored in the DA field, the SA field, the Type field, the DATA field, and the DCS field;

a DCS checking unit that compares the DCS code calculated by the code calculating unit with the DCS code stored in the DCS field of the received frame, and outputs a result of a comparison to the external terminal operating device as a result of a DCS check;

an FCS checking unit that compares the FCS code calculated by the code calculating unit with the FCS code stored in the FCS field of the received frame, and outputs a result of a comparison as a result of an FCS check;

an FCS converting unit that forwards the received frame without any change if the result of the FCS check is matching, and forwards a frame that the calculated FCS code is stored in the FCS field of the received frame if the result of the FCS check is mismatching;

an error frame counter that increments if the result of the FCS check is mismatching;

an alignment-error detecting unit that detects an alignment error by monitoring a frame length of the received frame;

a dummy-data creating unit that creates dummy data for filling a lacked portion of the received frame if an alignment error is detected by the alignment-error detecting unit; and an alignment error counter that increments a count value if an alignment error is detected by the alignment-error detecting unit, wherein the cyclic redundancy check calculating unit calculates a data check sequence code and a frame check sequence code using the dummy data created by the dummy-data creating unit, subsequent to the received frame, and the frame check sequence converting unit creates a frame that the dummy data is added to the received frame, and forwards the created frame in which the data check sequence code and the frame check sequence code, which are calculated with the dummy data, are respectively stored in a data check sequence field and a frame check sequence field.

* * * * *